United States Patent
Aguirre et al.

[11] Patent Number: 6,154,035
[45] Date of Patent: Nov. 28, 2000

[54] REMOTE CONTROL FLEET SAFETY INSPECTION SYSTEM

[76] Inventors: Francisco Aguirre; Rubin Aguirre, both of 15306 Orange Ave., Paramount, Calif. 90723

[21] Appl. No.: 09/175,375

[22] Filed: Oct. 19, 1998

[51] Int. Cl.$^7$ .............................. G01R 31/00; G01L 5/28
[52] U.S. Cl. ............................ 324/504; 324/503; 73/121
[58] Field of Search ................................. 324/503, 504; 340/825.72; 73/121, 146.5; 702/183, 184; 701/29, 31, 32, 34

[56] References Cited

U.S. PATENT DOCUMENTS

| D. 351,802 | 10/1994 | Tyler | D10/75 |
|---|---|---|---|
| 3,829,775 | 8/1974 | Brock | 324/115 |
| 4,586,370 | 5/1986 | Massender | 73/121 |
| 4,866,390 | 9/1989 | Butchko | 324/504 |
| 4,884,032 | 11/1989 | LaPensee | 324/504 |
| 5,083,457 | 1/1992 | Schultz | 73/146.5 |
| 5,086,277 | 2/1992 | Hammerly | 324/504 |
| 5,095,276 | 3/1992 | Nepil | 324/504 |
| 5,379,453 | 1/1995 | Tigwell | 455/151.2 |
| 5,394,093 | 2/1995 | Cervas | 324/556 |
| 5,488,859 | 2/1996 | Britt | 73/121 |
| 5,506,709 | 4/1996 | Segal et al. | 359/110 |

*Primary Examiner*—Safet Metjahic
*Assistant Examiner*—Anjan K Deb
*Attorney, Agent, or Firm*—Goldstein & Canino

[57] ABSTRACT

A safety inspection system includes a remote control unit having a user interface that is operated by a user to communicate commands to a main unit. The main unit is coupled to a power source, a source of pressurized air, and a trailer, such as a trailer of a tractor-trailer, to enable the user to verify the operation of a variety of lighting elements, which may include clearance and running lights, hazard lights, backup lights, turn signal indicators, and brake lights, and to further verify the operation of an air brake system of the trailer.

15 Claims, 6 Drawing Sheets

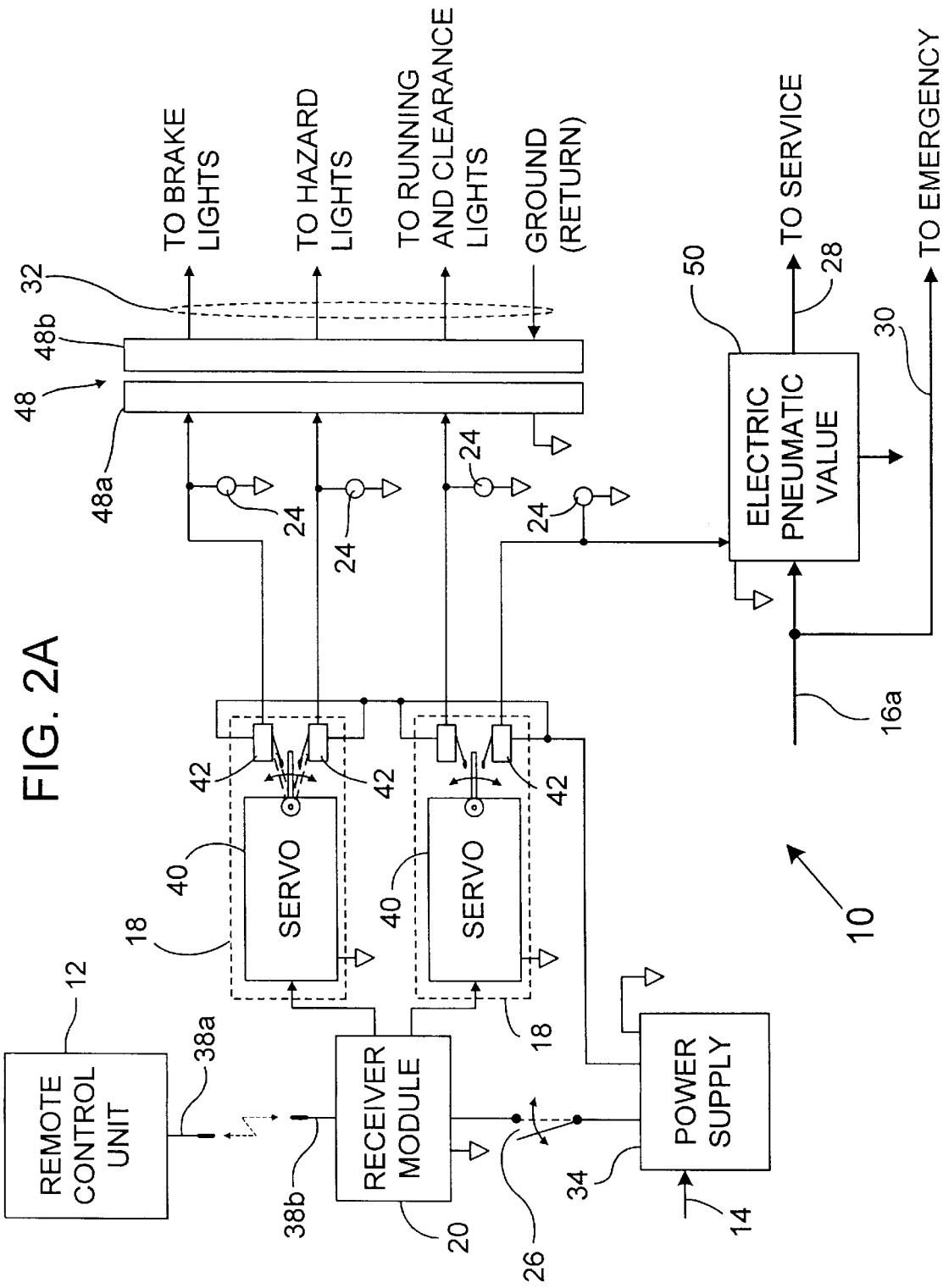

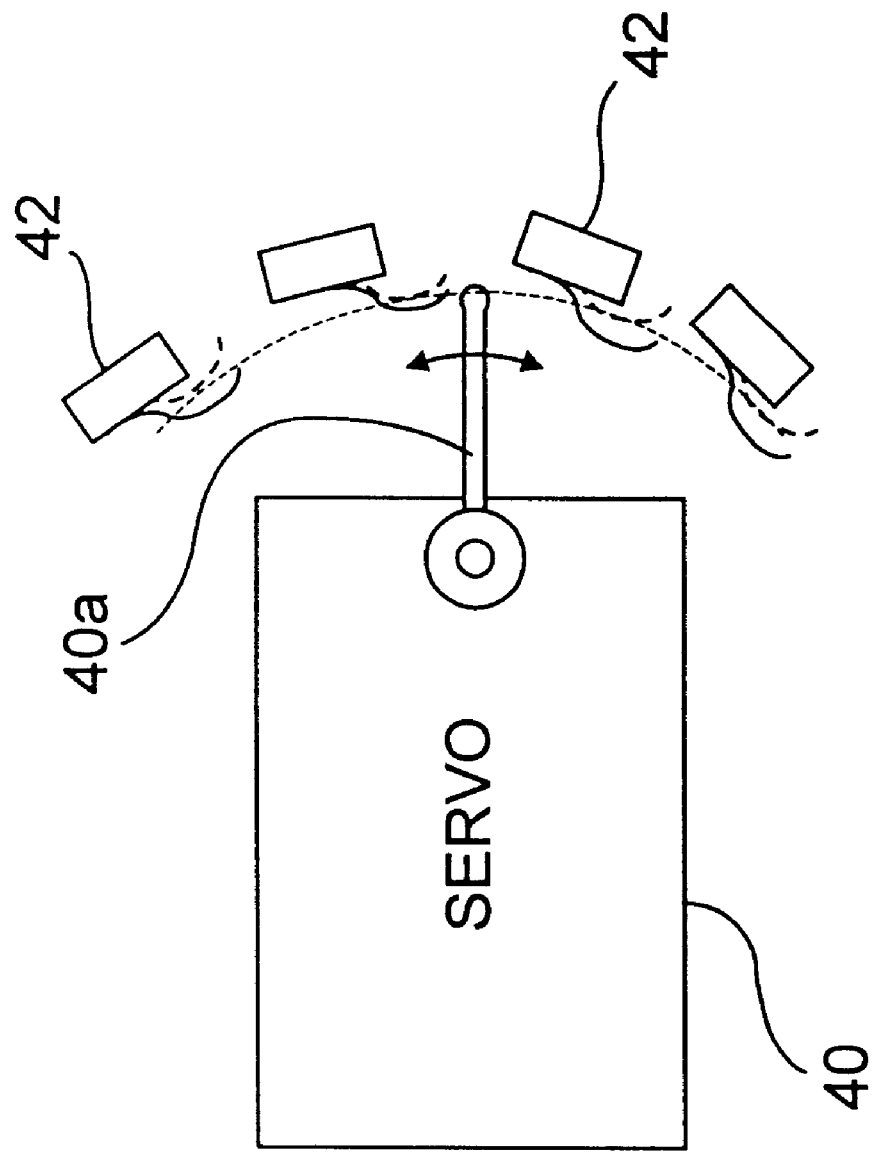

REMOTE CONTROL FLEET SAFETY INSPECTION SYSTEM

BACKGROUND OF THE INVENTION

1. Field of the Invention

The present invention relates to vehicle inspection devices. More particularly, the invention relates to a remote control safety inspection unit that may be employed to test and verify the operation of a plurality of fleet vehicle lighting elements and braking system devices.

2. Background and Objects of the Invention

The periodic inspection of lighting and braking systems on vehicles is required in many countries of the world. Such inspections are often conducted by two or more individuals. One individual is positioned in a drivers position of the vehicle and one or more others are positioned to view and or verify the operation of the lighting and braking systems. The lighting systems may include running, parking, clearance, backup, hazard, turn signal lights, and brake lights. While the brake systems may include hydraulic or pneumatic type systems. While this method of testing does verify the proper operation of these items, it generally requires at least two individuals. Thus, the undesirable cost of a second person's salary is incurred. A remotely activated system, wherein a single person may conduct such tests would be very useful.

When considering the testing and verification of lighting and braking systems of large trucks, such as tractor-trailer arrangements, it would be desirable for a single individual to be able to test the systems of a trailer portion, including a pneumatically operated braking system, without the need for a tractor actually being present. Several prior art devices, including those disclosed by U.S. Pat. No. 4,884,032 to LaPensee and U.S. Pat. No. 4,866,390 to Butchko, enable the lights of a trailer to be tested, but fail to include a means to also test the braking system of the trailer. Further, these systems do not support a simple and low cost remote operation feature. Such a feature is helpful to enable the various lighting, and in particular, the braking system to be carefully observed when operated by a single individual, such as a mechanic or a technician.

Therefore, when considering prior art vehicle and tractor-trailer testing devices and arrangements thereof, there is a need for a very simple, easy to use system that overcomes the above stated problems. Accordingly, objects and or characteristics of the present invention are to provide new and improved vehicle testing devices having one or more of the following capabilities, features, or advantages:

- enables a single individual to selectively operate any of the clearance and running lights, the hazard lights, turn signal lights, and the brake lights of a pull along portion of a vehicle, such as a trailer (of a tractor-trailer arrangement);
- enables the inspection and or verification of the operation of an air brake system of the vehicle;
- includes a hand holdable remote control unit having a user interface that is operable by a user;
- having a main unit (with a suitable housing) that is coupled to an AC or DC power source and a suitable pressurized pneumatic air supply during operation;
- includes switch means to couple the power source, preferably via an output from an internal power supply, to any one of the clearance and running lights, the hazard lights, and the brake lights of a trailer;
- the switch means may be structured to include electro-mechanical or semiconductor switching elements;
- includes connection means, structured to include at least one connector and a cable arrangement that couples switching elements of the switching means to enable an output of the power supply to be selectively applied, to activate one or more of the clearance and running lights, the hazard lights, turn signal lights, the brake lights, etc., for testing purposes;
- includes a switch (means or element) that activates at least one pneumatic value to operatively couple the pressurized air supply to the air brake system; and
- constructed of many off-the-self relatively low cost components.

The above listed objects, advantages, characteristics and or associated novel features of the contemplated embodiments of the present invention, as well as others, will become more apparent with a careful review of the description and figures provided within this disclosure. Attention is called to the fact, however, that the drawings and the associated description are illustrative and exemplary only, and variations are certainly possible.

SUMMARY OF THE INVENTION

In accordance with the present invention, a safety inspection system is disclosed that may be operably coupled to a trailer of a tractor-trailer unit, or another 'pull-along' vehicle portion, to enable a user to verify the operation of a plurality of lighting elements including clearance and running lights, hazard lights, turn signal lights, and brake lights, and to further verify the operation of an air brake system of the trailer. The safety inspection system includes a hand-holdable wireless remote control unit. The remote control unit includes a transmitter, and a user interface that is operable by the user. A main housing is provided along with a power supply (preferably housed within the main housing) that is coupleable to an external power source to energize the power supply. The power supply is configured to provide at least one output or output voltage level. A receiver module is housed within the main housing and is powered by an output of the power supply. The receiver module is structured to receive information from the remote control unit transmitted via the transmitter contained therein. The information includes (or represents) user generated commands to selectively activate and deactivate any of the lighting elements, as well as the air brake system of the trailer.

Also included within the main housing of the main unit are switching means that are operatively coupled to, and responsive to, the receiver module. The switching means are structured to include a plurality of switching elements, wherein each switching element may be operated between an open state and a closed state. Connection means are included that are structured to couple the switching means to the trailer to be tested such that the switching elements, which are interposed between the connection means and one or more outputs of the power supply, may selectively cause the coupling of at least one output of the power supply to the trailer in order to selectively activate at least one of the lighting elements (when respective switching elements are in the closed position) and deactivate the lighting elements (when respective switching elements are in the open position). A pneumatic valve, which is also responsive to the switching means and housed within the main unit, is coupleable to a pneumatic source on an input side and coupleable to the air brake system of the trailer on an output side. The pneumatic valve is operable via the switching means between an off-state wherein the pneumatic source is not coupled to the air-brake system of the trailer and an on-state wherein the pneumatic source is coupled to the air brake system. The pneumatic value is selectively operable between the off-state and the on-state by the user employing the remote control unit to enable the user to verify the operation of the air brake system.

It is important to note that a single individual may employ the safety inspection system of the present invention to carefully test any of the lighting elements including the clearance and running lights, the hazard lights, turn signal lights, the brake lights, and the air brake system of the trailer in an unassisted fashion without the need of other individuals. Accordingly, the testing of the lighting elements and the air brake system may be conducted with the user of the system freely moving about the trailer or positioned under the trailer, as required.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows:

FIG. 2A provides a block diagram of a preferred embodiment of the functional elements of the invention.

FIG. 2B depicts an alternate structure employable for a single servo to activate a plurality of electromechanical switching elements.

LIST OF REFERENCE NUMERALS USED IN THE DRAWINGS

10—main unit of safety inspection system
10a—main housing of main unit 10
12—remote control unit
12a—front panel
14—power coupler
16—pneumatic coupler
16a—pressurized pneumatic source
18—switching means
20—receiver module
22—receiver and control module
22a—interface
24—annunciators
26—on-off switch
28—pneumatic service coupler
30—pneumatic emergency coupler
32—(multi-conductor) electrical cable
34—power supply
38a—antenna (of remote control unit 12)
38b—antenna (of main unit 10)
40—servos
40a—controllable lever arm
42—switching elements 42a—electronic switches
48—connection means
48a—first connector
48b—second connector
50—(electronic) pneumatic value
60—internal power source
62—user interface (of the remote control unit 12)
64—control module
66—transmitter module

DETAILED DESCRIPTION OF THE PREFERRED EMBODIMENTS

It is important to establish the definition of several terms and expressions that will be used throughout this disclosure. The terms 'transmitter' and 'receiver' are to indicate any wireless transmitter receiver arrangement that will enable information (e.g., issued commands) to be sent from a first unit (e.g., a remote control unit) to a second unit (e.g., a main unit). As such, simple and common radio-controlled (R/C) type transmitter-receiver arrangements may be employed, as well as others available in the art. The term 'coupled' is to indicate the connection of one item to a second item either directly or with other intervening items (that may be provided by skilled persons). For example, the coupling of a switch means to a receiver may involve other intervening items or interface components. Finally, the expression 'any of the lighting elements' is to indicate any group of lighting elements including the clearance and running lights (group), the hazard lights, turn signal lights, the brake lights, etc. Additional terms and expressions will be defined below, as required.

Figure 1A:
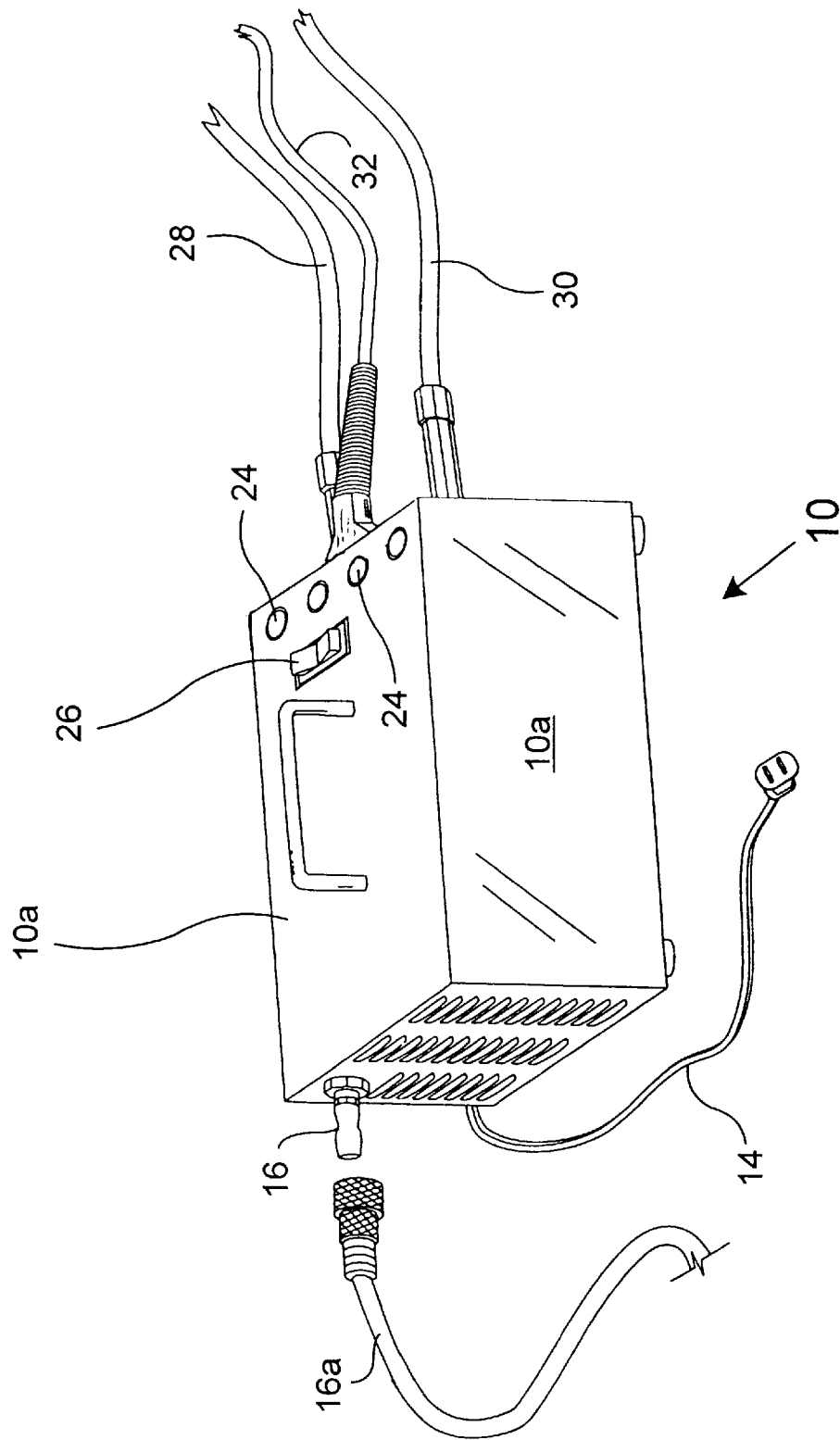
FIGS. 1A and 1B provide perspective diagrammatic view of a main unit (and housing) and a remote control unit, respectively, in accordance with the present invention.

Turning now to FIG. 1A, there is illustrated a perspective view of a main unit 10 of a safety inspection system may be operably coupled to trailer of a tractor-trailer (not shown) to enable a user to verify the operation of any of the clearance and running lights, the hazard lights, turn signal lights, and the brake lights, and to further verify the operation of an air brake system of the trailer. More generally, the above listed lights or indicators of the trailer may be termed lighting elements that are typically grouped such that all or a portion of the lights (bulbs) of any particular group may be selectively activated, as required. Shown is a power coupler 14, depicted as a standard 110V plug, which is provided to couple the main unit (and internal parts/items) to a suitable an external power source. The external power source may be any available AC or DC source a (preferably) internal power supply is configured to accept. As can be seen in FIG. 1, the main unit 10 is configured with a main housing 10a. As will be discussed in greater detail when referring to FIGS. 2A and 3, the main housing 10a may be structured to house the internal power supply 34, a receiver module 20, a pneumatic valve 30, and switching means 18 (all of which can be best seen in FIGS. 2 and 3). The main unit 10 further includes means, depicted as pneumatic coupler 16, which enables a pressurized pneumatic air source 16a to be coupled to the main unit 10.

FIG. 1A further illustrates a plurality of annunciators 24 and an on-off switch 26 that are provided to assist an individual when operating the safety inspection system of the present invention. Coupling means including an electrical cable 32, a service pneumatic coupler 28, and an emergency (service) pneumatic coupler 30, which are and arrangeable in one form or another well known in the art, couple the main unit 10 of the safety inspection system of the present invention to a trailer vehicle portion that is to be inspected and or tested.

Figure 1B:
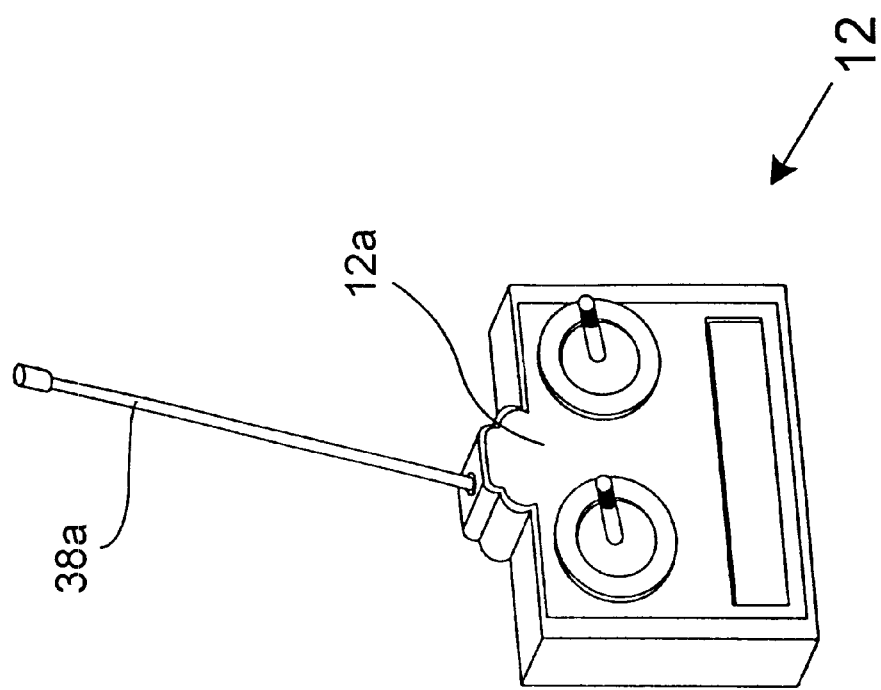

As shown in FIG. 1B, the safety inspection system of the invention includes a hand-holdable wireless remote control unit 12 having a front panel 12a. The front panel 12a may be arranged with a user interface including switches, control levers, displays, and the like. Skilled persons will appreciate the number of configurations providable for the front panel 12a to establish a suitable user interface. As will be discussed, the remote control unit 12 includes a transmitter that is operatively coupled to an antenna 38a that enables information, say in the form of user issued commands, to be sent in a wireless manner from the remote control unit 12 to the main unit 10.

Referring now to FIG. 2A, there is provided a block diagram of a preferred embodiment of functional elements of the safety inspection system in accordance with the present invention. A power supply 34 is coupleable to a suitable external power source via the power coupler 14 to energize the power supply 34. It is important to understand the power supply may be embodied to convert, adjust, regulate and or filter the power source coupled by the power coupler 14. The power supply 42 is provided to energize, as required, the various components of the main unit 10. As such, the power supply may actually generate several differing levels of power to be supplied to these components via a plurality of outputs. As can be seen, a receiver module 20 is included that is coupled to a suitable antenna 38b. The receiver module may more generally be termed a 'receiver'. The receiver module 20, which is arranged to receive information (e.g., issued commands) from the remote control unit 12, is operatively coupled to a plurality of servos 40. Each servo 40 is structured with a controllable lever arm 40a that is movable by issued user commands/information from a first position to either of a second position or a third position (as shown in dotted lines). Skilled artisans will appreciate that the controllable lever arm 40a may be rotated in a controlled fashion so as to assume one of a plurality of positions anywhere between the second and third positions shown. As the controllable lever arm 40a is moved or rotated to the second or third positions a switching element 42 may be operated from the open state to the closed state. In the open state the switching element 42 is open and no electrical power passes therethrough. In the closed state the switching element 42 is closed and power from an output of the power supply 42 may be coupled to a desired electrical path. As illustrated in FIG. 2A, each servo 40 is arranged to operate one of two switching elements 42, with a first switching elements operated when the controllable lever arm 40a is in the second position, and a second switching element operated when the controllable lever arm 40a is in the third position. It should be noted that the combination of the servo 40, the controllable lever arm 40a, and the switching elements 42 may be termed a 'switching means', and as will be addressed in FIG. 3, may be provided by a number of suitable arrangements.

As shown in FIG. 2A, the switching elements 42 are coupled to connection means 48, which may be arranged with a first connector 48a and a second connector 48b. Although many arrangements are possible, in a preferred embodiment of the invention the first connector 48a would be mounted to and available on the main housing 10a of the main unit 10. The second connector 48b may be provided at one end of a multi-conductor electrical cable 32 that is in turn coupled or connected to the trailer and its associated lighting elements. As indicated above the lighting elements may include any and all of the clearance and running lights, the hazard lights, the brake lights, and other available lights or lighting elements that require inspection. Accordingly, with the preferred arrangement of FIG. 2A, the 'switching means' is interposed between the connection means and the power supply, and is operatively coupled to, and responsive to, the receiver module 20. As information is received from the remote control unit 12 via the receiver 20 the position of the controllable lever arm 40a may be altered to activate one or more switching elements 42 of the switching means. As one ore more switching elements 42 are operated between an open state and a closed state, power from the power supply 34 is directed to, or coupled to, activate selected (desired) lighting elements including any of the clearance and running lights, hazard lights, turn signals, and or brake lights. As switching elements are operated between the closed state and the open state, respective lighting elements associated therewith are deactivated. Also, respective annunciators 24 will be energized to indicate when a respective switching element 42 has been activated. It may be noted that the safety inspection system depicted in FIG. 2A, is structured as a two channel servo based system. Also, the switching elements of FIG. 2A may be termed electromechanical switches or simply micro-switches.

As clearly seen in FIG. 2B, configurations of the servo 40 and the switching elements 42 may be provided to enable a single servo to activate more that two switching elements. In the arrangement of FIG. 2B, the servo may be activated to sequence through a plurality of individually controllable lighting elements (or groups thereof) of the trailer. Accordingly, the switching means of FIG. 2A is intended to be illustrative only, with other exemplary switching means providable by skilled persons.

In order to support the testing of the (pneumatic) brake system employed with tractors, an electric pneumatic value 50 is included within the main unit 10. The pneumatic value 50, which is responsive to the switching means, is coupleable to a pressurized pneumatic supply or source 16a on an input side and coupleable to the air brake system of the trailer on an output side. The output side of the pneumatic value 50 may be termed the service side or service coupler 28. The pneumatic valve 50 is structured to be operable between an off-state wherein the pneumatic source 16a is not coupled to the air-brake system of the trailer and an on-state wherein the pneumatic source 16a is coupled to the air brake system. As with the lighting elements of the trailer, the pneumatic value 50 is operable between the off-state and the on-state by the user via the remote control unit and a suitable switch means (of the main unit). This arrangement enables the user to carefully verify the operation of the air brake system. As skilled persons will appreciate, the ability of an individual to operate the air brake system remotely, for example while positioned under the trailer, will enable inspection of items such as the brake chamber houses and nuts, the maxi-bolt alignments, the travel of the slave adjuster, and the return characteristics of the return springs. This provides a powerful diagnostic capability realized by a single, unassisted inspection person.

Figure 3:
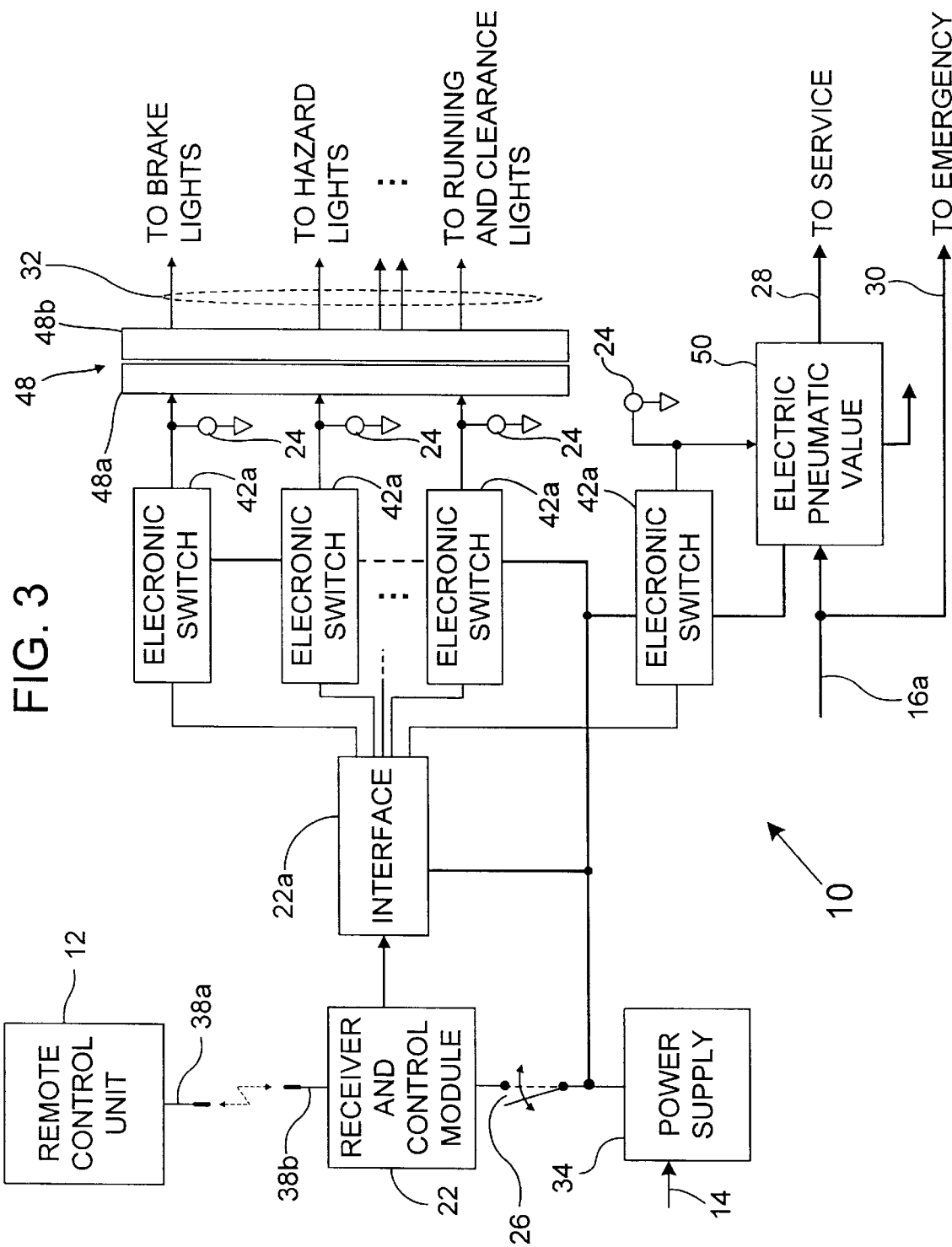
FIG. 3 is a block diagram of another embodiment of the safety inspection system in accordance with the invention.

Referring now to FIG. 3, there is provided a block diagram of another embodiment of the safety inspection system in accordance with the invention. This embodiment may be termed an 'electronic' version that does not rely on so heavily on mechanical components such as servos, electro-mechanical switches, etc. A key component of the embodiment of FIG. 3 is the electronic switches 42a, which represent switching elements that may be provided by reed relays or semiconductor switches. It may be noted that the electronic switches 42a may be termed a plurality of electronic switching elements. Further, the power supply 34, the power coupler 14, the connection means 48, annunciators 24, and the pneumatic value 50 operate as described above when discussing the embodiment of FIG. 2A. As skilled artisans will understand the interface 22a, as well as other components including the electronic switches 42a, must be energized (e.g., biased) to operate properly. As such, these items and components must be powered (energized) by one or more outputs of the power supply 34.

As can be seen in FIG. 3, a receiver and control module 22 is operatively coupled to an interface module 22a. Information transmitted from the remote control unit 12 is received by the receiver and control module 22 and via the interface unit 22a is applied to the plurality of electronic switches. Each electronic switch is structured to be operable between an on-state wherein an output of the power supply 34 is coupled a portion of the connection means 48 and an off-state wherein the power supply output is not coupled to the connection means 48. Accordingly, the electronic switches 42a provide a function that is equivalent to the switching elements 42 of FIG. 2A.

It is important to understand that the embodiment of the safety inspection system of FIG. 3 is to be defined broadly. As such, the receiver and control module 38b, and the interface 22a, may be implemented by a programmable logic device, or alternately by an embedded system or PLC with a simple (off the shelf) receiver unit operatively coupled thereto. Skilled persons will appreciate the variety of system architectures available to implement the embodiment of FIG. 3.

Figure 4:
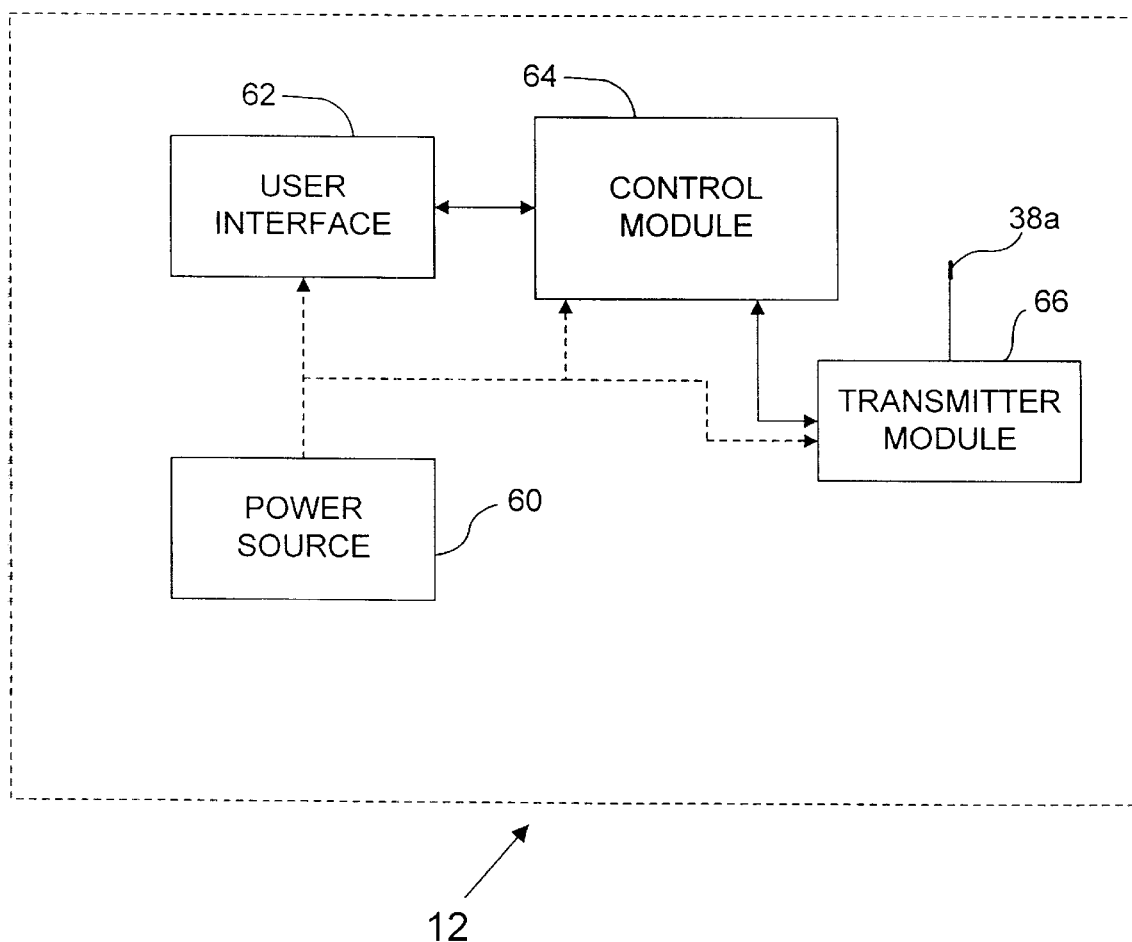
FIG. 4 provides a block diagram of an embodiment of the remote control unit.

Turning now to FIG. 4, an illustrative embodiment of the remote control unit 12 is provided in the form of a block diagram. An internal power source 60, preferably provided by a rechargeable battery, is included to energize the various components of the remote control unit 12. As discussed above, the remote control unit 12 includes the front panel 12a with a user interface 62 mounted thereon. The user interface 62 provides suitable controls that may be operated by the user to enable the user to selectively activate one or more of the lighting elements of the trailer and or the air brake system. The controls may include one or more control levers (as can be seen in FIG. 1B), slide controls, rocker switches, push buttons, etc, which are well known in the art. The controls may be operated by the user to enable the user to selectively activate at least one of the lighting elements and the air brakes. A control module 64 may be included to interface the user interface 62 to a transmitter module 66. The transmitter module 66 includes a transmitter (as discussed above) that is operatively coupled to the antenna 38a to receive issued commands (i.e., information) from the remote control unit. The control module 64 may further include embedded controllers or programmable logic to support the operation of the remote control unit 12.

It should be understand that the description of the embodiments of the safety inspection system of the present invention are illustrative only, and other equivalent arrangements are certainly possible. For example, the use of a mechanical pneumatic value, say activated by the controllable lever arm 40a of a server 40, may be substituted for the electronic pneumatic value 50. Therefore, while there have been described the currently preferred embodiments of the invention, those skilled in the art will recognize that other and further modifications may be made without departing from the present invention, and it is intended to claim all such modifications and variations as fall within the scope of the appended claims.

What is claimed is:

1. A safety inspection system that may be operably coupled to trailer of a tractor-trailer unit to enable a user to verify the operation of a plurality of lighting elements including clearance and running lights, hazard lights, and brake lights, and to further verify the operation of an air brake system of the trailer, the safety inspection system comprising:

a) a hand-holdable wireless remote control unit, the remote control unit having a transmitter and a user interface that is operable by the user;
   b) a main housing;
   c) a power supply that is coupleable to an external power source to energize the power supply, the power supply providing at least one output;
   d) a receiver module housed within the main housing that is powered by an output of the power supply, the receiver module structured to receive information from the remote control unit via the transmitter contained therein;
   e) switching means operatively coupled to, and responsive to, the receiver module, the switching means providing a plurality of switching elements, wherein each switching element may be operated between an open state and a closed state;
   f) connection means that is structured to couple the switch means to the trailer to be tested such that the switching elements, which are interposed between the connection means and the power supply, selectively cause the coupling of an output of the power supply to the trailer in order to selectively activate at least one of the lighting elements, when respective switching elements are in the closed position, and deactivate the lighting elements, when respective switching elements are in the open position; and
   g) a pneumatic valve, which is responsive to the switching means, that is coupleable to a pneumatic source on an input side and coupleable to the air brake system of the trailer on an output side, the pneumatic valve operable between an off-state wherein the pneumatic source is not coupled to the air-brake system of the trailer and an on-state wherein the pneumatic source is coupled to the air brake system, the pneumatic value operable between the off-state and the on-state by the user via the remote control unit and the switch means to enable the user may verify the operation of the air brake system.

2. The safety inspection system in accordance with claim 1, wherein the individual may test any of the lighting elements including the clearance and running lights, the hazard lights, the brake lights, and the air brake system of the trailer unassisted without the need of other individuals.

3. The safety inspection system in accordance with claim 2, wherein the remote control unit includes a front panel with a plurality of control levers, which may be operated by the user, to enable the user to selectively activate at least one of any of the lighting elements, and the air brake system of the trailer.

4. The safety inspection system in accordance with claim 3, wherein the switching means includes:

a) at least two servos provided within the main housing of a main unit, each servo structured with a controllable lever arm that is movable from a first position to either of a second position and a third position, and
   b) the plurality of switching elements, with at least one switching element associated with each servo, so that at least one switching element is operated from the open state to the closed state by the movement of a respective controllable lever arm to either of the second position or the third position.

5. The safety inspection system in accordance with claim 4, wherein the switching elements are provided by electromechanical switches.

6. The safety inspection system in accordance with claim 5, wherein said system is structured as a two channel servo based system.

7. The safety inspection system in accordance with claim 4, wherein the housing includes a plurality of annunciators, each respective annunciator configured to indicate when an output of the power supply has been suitably coupled to activate one of the clearance and running lights, the hazard lights, the brake lights, and the air brake system of the trailer.

8. The safety inspection system in accordance with claim 2, wherein the remote control unit includes a front panel with a user interface having controls that may be operated by the user to enable the user to selectively activate at least one of the switching elements of the switch means.

9. The safety inspection system in accordance with claim 8, wherein the switching means includes:
   a) an interface that is powered by the power supply and responsive to a receiver and control module; and
   b) a plurality of electronic switching elements, wherein each electronic switching element is structured to be operable between an on-state wherein the power supply is coupled a portion of the connection means and an off-state wherein the power supply is not coupled to the connection means, the electronic switching elements responsive to the interface and receiver and control module.

10. The safety inspection system in accordance with claim 9, wherein the switching elements are provided by one of either a plurality of reed relays and a plurality of semiconductor switches.

11. The safety inspection system in accordance with claim 10, wherein the housing includes a plurality of annunciators, each respective annunciator configured to indicate when an output of the power supply has been suitably coupled, via a switching element, to activate one of the clearance and running lights, the hazard lights, the brake lights, and the air brake system of the trailer.

12. A safety inspection system that may be operably coupled to trailer of a tractor-trailer arrangement to enable a user to verify the operation of any of the lighting elements and to further verify the operation of an air brake system of the trailer, the safety inspection system comprising:
   a) a hand-holdable remote control unit, the remote control unit having a transmitter module and a user interface providing a plurality of user controls that are operable by the user;
   b) a main unit structured with a receiver module and a plurality of switching means operatively coupled to, and responsive to, the receiver module; the switching means switchable between an open state and a closed state, the main unit coupleable to an external power source to energize an internal power supply that couples to an input side of the switching means, while an output side of the switching means is coupled to the tractor to enable the activation of any of light elements including the clearance and running lights, hazard lights, and brake lights, and to further verify the operation of an air brake system;
   c) the safety inspection system operated by a single user employing the remote control unit and issuing commands therefrom that are transmitted via the transmitter module and received by the receiver module, the received commands causing the activation of the switching means to selectively activate of any of the lighting elements, and a pneumatic value;
   d) the pneumatic value provided within the main unit and coupleable to a pneumatic source on an input side of the pneumatic valve and coupleable to the air brake system of the trailer on an output side of the pneumatic valve, the pneumatic valve operated from an off-state, wherein the pneumatic source is not coupled to the air-brake system, to an on-state wherein the pneumatic source is coupled to the air brake system, the pneumatic value operable between the off-state and the on-state by the user via the remote control unit and the switch means to enable the user may verify the operation of the air brake system.

13. The safety inspection system in accordance with claim 12, wherein the individual may test any of the lighting elements and the air brake system of the trailer unassisted without the need of other individuals.

14. The safety inspection system in accordance with claim 13, wherein the remote control unit includes a front panel with a plurality of control levers, which may be operated by the user, to enable the user to selectively activate any of the lighting elements including at least one of the clearance and running lights, the hazard lights, the brake lights, as well as the air brake system of the trailer.

15. The safety inspection system in accordance with claim 14, wherein the switching means includes:
   a) at least two servos provided within the main housing of a main unit, each servo structured with a controllable lever arm that is movable from a first position to either of a second position and a third position, and
   b) a plurality of electromechanical switching elements, with at least one switching element associated with each servo, so that at least one switching element is operated from the open state to the closed state by the movement of a respective controllable lever arm to the first position, the second position, or a suitable position therebetween.

* * * * *